United States Patent [19]

Bowers et al.

[11] Patent Number: 5,334,048
[45] Date of Patent: Aug. 2, 1994

[54] ELECTRICAL CONNECTOR WITH BOARD RETENTION DEVICE

[75] Inventors: Michael D. Bowers, Halifax; Robert E. Klinger, Harrisburg; Mark R. Thumma, Oberlin; David P. Wike, Hummelstown, all of Pa.

[73] Assignee: The Whitaker Corporation, Wilmington, Del.

[21] Appl. No.: 41,801

[22] Filed: Apr. 1, 1993

[51] Int. Cl.⁵ .................................... H01R 13/73
[52] U.S. Cl. .................................... 439/567
[58] Field of Search ............ 439/567, 571, 554, 555, 439/557, 558

[56] References Cited

U.S. PATENT DOCUMENTS

| | | |
|---|---|---|
| 3,501,736 | 3/1970 | Norris .................. 439/567 |
| 3,744,009 | 7/1973 | Teagno et al. ........... 439/329 |
| 4,025,142 | 5/1977 | Huber et al. ............ 439/470 |
| 4,080,522 | 3/1978 | Schimmels .............. 200/295 |
| 4,154,498 | 5/1979 | Wood et al. ............ 439/557 |
| 4,453,195 | 6/1984 | Sauer et al. ............ 361/156 |
| 4,477,142 | 10/1984 | Cooper et al. .......... 439/567 |
| 4,857,017 | 8/1989 | Erk .................... 439/695 |
| 4,861,943 | 8/1989 | Yarmark ................ 174/52.1 |
| 4,869,672 | 9/1989 | Andrews, Jr. .......... 439/60 |
| 5,076,804 | 12/1991 | Bertho et al. .......... 439/567 |
| 5,108,314 | 4/1992 | Takano et al. .......... 439/621 |
| 5,145,384 | 9/1992 | Asakawa et al. ........ 439/78 |
| 5,178,554 | 1/1993 | Siemon et al. ......... 439/188 |

Primary Examiner—Gary F. Paumen
Attorney, Agent, or Firm—Bruce J. Wolstoncroft

[57] ABSTRACT

A panel mount connector (10) has a housing (20) with a first mounting surface or shoulder (42) and a mounting post (30) extending therefrom. The mounting post (30) has a deformable web (50) which is deformed as the housing (20) is inserted onto the panel (12), so that the deformable web (50) and first mounting surface (42) cooperate to maintain the connector (10) in position on the panel (12).

18 Claims, 4 Drawing Sheets

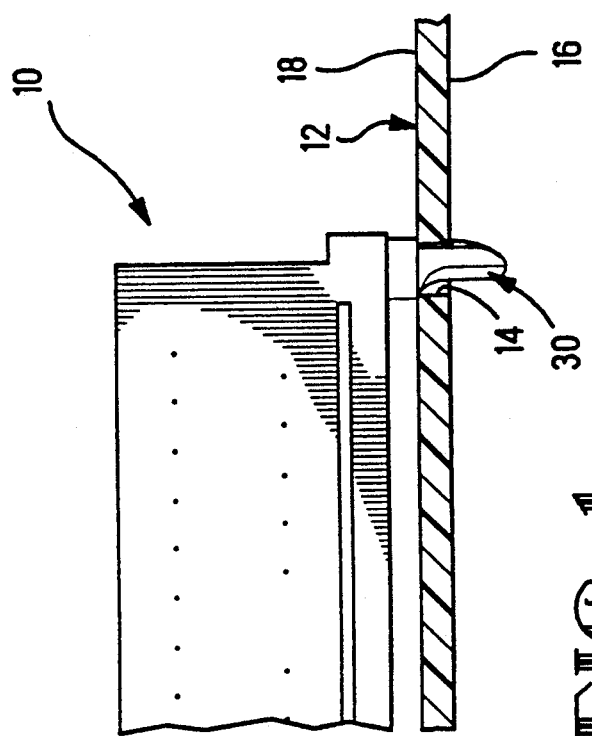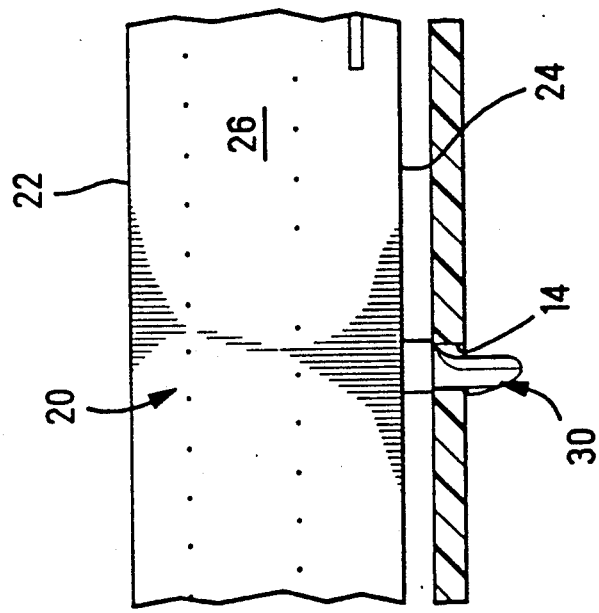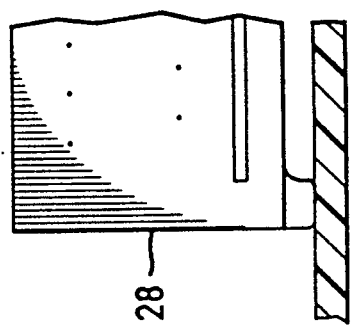
FIG. 1

5,334,048

ELECTRICAL CONNECTOR WITH BOARD RETENTION DEVICE

FIELD OF THE INVENTION

The invention relates to an electrical connector which has a retention device to maintain the connector in position on a panel. In particular, the retention device has a web which ensures that the connector will be firmly maintained in position relative to a printed circuit board.

BACKGROUND OF THE INVENTION

There are a number of connectors available in the market which have terminals which cooperate with conductive areas on a printed circuit board. In order for the electrical connection to be established and maintained between the terminals and the conductive areas, the electrical connector must be secured to the printed circuit board.

In the past, one method of attaching the connector to the board was to use screws. The screws would cooperate with openings on the connector and the printed circuit board to maintain the connector in position. Although this provides a positive securing means, the use of screws was labor intensive, required the use of valuable board real estate, and was expensive as many separate pieces were required.

Other methods include using metal clips or other separate board lock devices to secure the connector to the board. These metal clips and separate board lock devices have the same disadvantages as described above.

In an effort to minimize the board real estate occupied by the various board lock features described above, and in order to minimize the cost associated therewith, various connectors have employed the use of integral plastic posts which extend from a bottom surface of the connector. The integral posts are dimensioned to extend beyond the printed circuit board and are generally used as a temporary hold down until the connectors are heat staked or soldered in permanent position. However, although these integral posts maintain the connector in position relative to the board, in many instances the connector is not firmly held in position (i.e. the connector has some freedom of movement relative to the board). This is due to the fact that dimensions cannot be precisely controlled during the molding of the posts and the manufacture of the printed circuit boards. Consequently, in many instances the dimensions are such to allow the board to float relative to the connector. This is an unacceptable result, particularly in application in which close centerline spacing of the contact areas is required.

Other integral posts have been dimensioned to ensure for a tight frictional engagement between the side walls of the opening of the board and the side walls of the posts. This configuration results in erratic insertion forces because of the tolerances associated with the opening and the post. Consequently, this type of interference fit can lead to unacceptably high insertion forces or unacceptably low retention forces.

SUMMARY OF THE INVENTION

The invention is directed to a cost effective means to hold an electrical connector to a panel. The connector provides a high retention force while providing a self adjusting feature to compensate for variations in board thickness.

The panel mount connector has a housing with a first mounting surface or shoulder and a mounting post extending therefrom. The mounting post has a deformable web which is deformed as the housing is inserted onto the panel, so that the deformable web and first mounting surface cooperate to maintain the connector in position on the panel.

The mounting post has a fixed end portion which is integral with the housing and a free end portion which is spaced from the fixed end portion. A latching projection is provided on the free end portion. The post is configured to allow the free end portion to be resiliently deflected to a stressed position as a lead-in surface of the latching projection engages a side wall of an opening of the printed circuit board. As the latching projection is moved beyond the printed circuit board, the mounting portion is returned to a relatively unstressed position, causing the deformable web to be moved into engagement with the printed circuit board, whereby the force associated with the mounting post returning to the unstressed position is sufficient to cause the deformable web to be deformed as it engages the printed circuit board.

BRIEF DESCRIPTION OF THE DRAWINGS

FIG. 1 is a side view of an electrical connector in cooperation with a printed circuit board, the terminals of the connector are not shown.

DETAILED DESCRIPTION OF THE INVENTION

Figure 2:
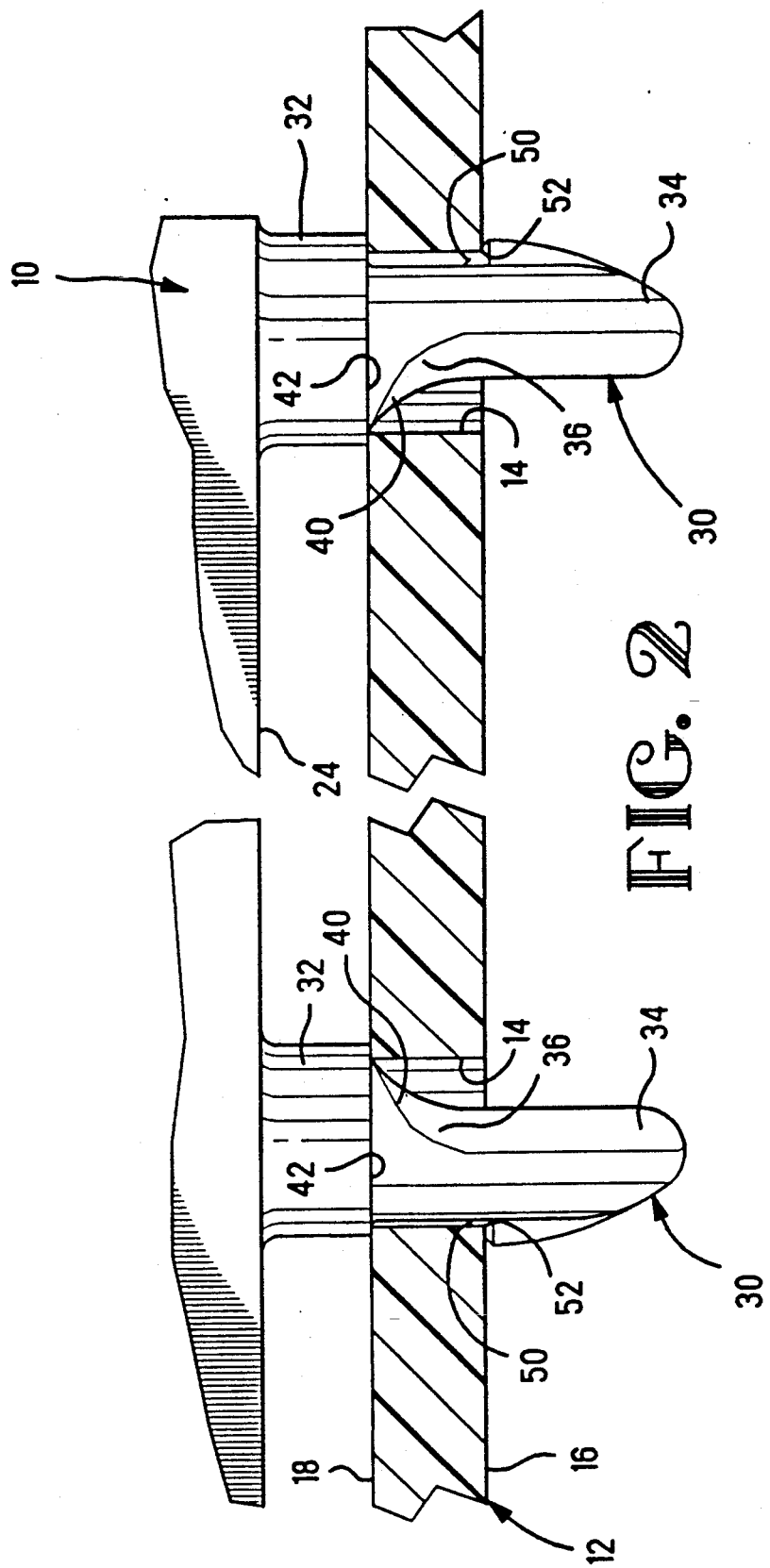
FIG. 2 is an enlarged fragmentary view of the mounting posts of the electrical connector, the printed circuit board is shown in cross-section to better illustrate the operation of the mounting posts.

With reference to FIG. 1, a card edge connector 10 is shown. Connector 10 has an elongate dielectric housing 20 which has a top wall 22, a bottom wall 24, side walls 26 which extend between the top wall and the bottom wall, and end walls 28 which extend between the side walls. The connector shown in FIG. 1 depicts the housing with no terminals positioned therein. However, in operation the housing would have terminals which make electrical connection with openings (not shown) in the printed circuit board 12 or conductive areas (not shown) on the printed circuit board. The particular connector shown is fully described in U.S. Pat. No. 4,869,672, which is hereby incorporated by reference.

As best shown in FIGS. 1 and 2, posts 30 extend from bottom wall 24 of housing 20 in a direction away from top wall 22. The posts are integrally molded to the housing 20.

Figure 3:
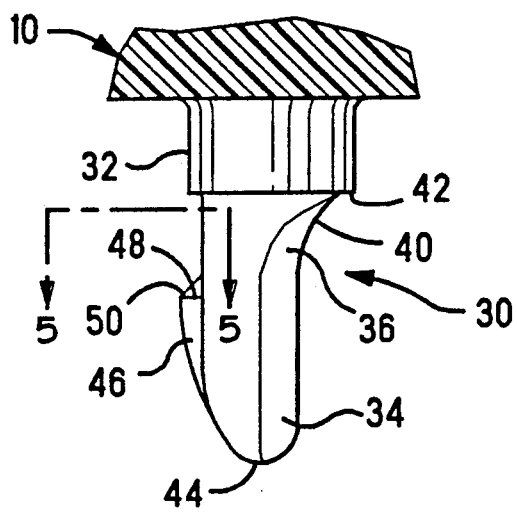
FIG. 3 is an enlarged side view of one mounting post prior to insertion into an opening provided in the printed circuit board.
Figure 4:
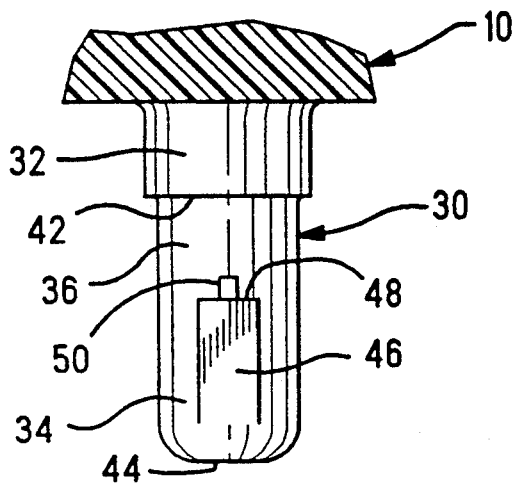
FIG. 4 is an enlarge front view of the mounting post shown in FIG. 3.
Figure 5:
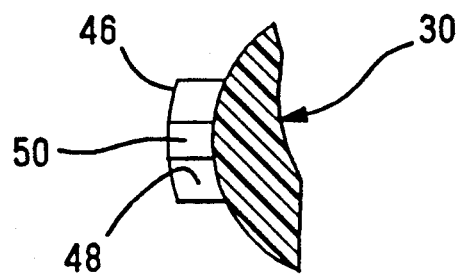
FIG. 5 is a partial cross-sectional view taken along lines 5—5 of FIG. 3.

Referring now to FIGS. 3 through 5, each post 30 has a fixed end portion 32, a free end portion 34, and a transition portion 36. The fixed end portion 32 is integral with and extends from the bottom wall 24 and has a circular cross-section. The diameter of the circular cross-section is dimensioned to be greater than the diameter of the opening 14 in the printed circuit board 12 into which the post will be inserted.

Transition portion 36 extends from fixed end portion 32 in a direction away from the bottom wall 24. As best shown in FIG. 3, the transition portion has a tapered surface 40 which extends from the fixed end portion to the free end portion. A shoulder 42 is positioned between the fixed end portion 32 and the transition portion 36.

Free end portion 34 extends from the transition portion 36 away from the bottom wall 24. The end 44 of the free end portion 34 has an arcuate configuration. A latching projection 46 is provided on the free end portion. The latching projection 46 has a lead-in surface and a latching shoulder 48 which is configured to be essentially parallel to the bottom wall 24 of the housing. A triangular deformable web 50 extends from the latching shoulder 48 toward the bottom wall 24. The deformable web and the latching projection 46 are integrally molded to the post, and are therefore made of the same material, however the deformable web 50 has a thinner cross-section than the latching projection, as viewed in FIGS. 4 and 5. In alternate embodiments, it is conceivable that the web will not have a thinner cross-section than the latching projection. In these instances, the resiliency of the post will generate a sufficient force to detent the surface of the web.

Figure 6:
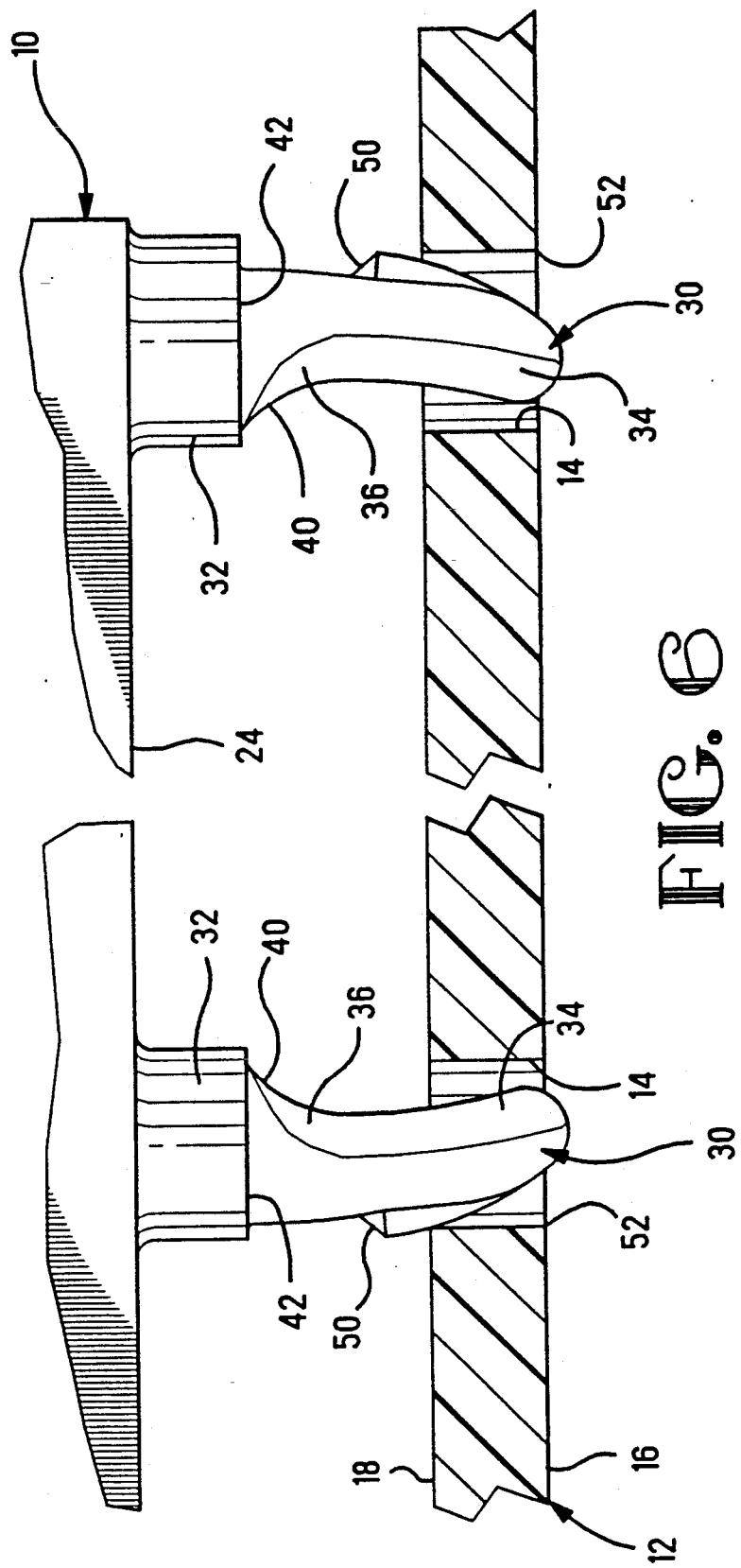
FIG. 6 is an enlarged fragmentary view of the mounting post similar to that of FIG. 2, showing the deformation of the post as the post is inserted into the opening of the printed circuit board.

Referring back to FIG. 1, connector 10 is positioned on printed circuit board 12 such that posts 30 extend through openings 14. The transition portions 36 and free end portions 34 are configured to provide resiliency to the posts. Consequently, if the connector is moved toward the board such that the bottom wall 24 is parallel to the circuit board 12, the lead-in surfaces of the latching projections 46 will engage side walls of the openings 14, causing the posts 30 to be caused to resiliently deform, as shown in FIG. 6. As the insertion of the connector continues, the latching projections 46 are moved beyond the bottom of the circuit board 12, as shown in FIG. 2. As the latching projections are moved beyond the bottom of the board, the posts will move toward the unstressed position.

It is worth noting that the latching projections 46 of the posts shown in FIG. 1 face in opposed directions. Therefore, as the posts are inserted into the openings, the posts will be resiliently deformed toward each other. As the latching projections 46 are moved beyond the bottom surface 16 of the circuit board 12, the posts 30 snap back toward their unstressed position. As the posts are snapped back in opposed directions, the cooperation of the posts 30 with the side walls of the openings 14 ensures that the connector will be prevented from movement relative to the circuit board 12 in a direction which is parallel to the bottom surface 16 of the circuit board.

The configuration of the posts 30 also allows the connector 10 to be rotated into position. In this operation, one post is positioned in a respective opening of the circuit board. The connector is then rotated so that the second post is positioned in a second respective opening. The configuration of the free end portion 34 and the transition portion 36 have arcuate surfaces thereon to allow for easy rotation of the connector. As the second post is moved into cooperation with the second opening, both posts experience some resilient deformation as stated above. The manner in which the posts deform are essentially as described above.

The positioning of the connector 10 on the circuit board 12 continues until shoulders 42 engage the top surface 18 of the circuit board 12. In this position, the fixed end portions 32 behave as stand-offs, thereby allowing the terminals to be properly soldered, as is well known in the art. At the same time the shoulders 42 engage the circuit board 12, the latching projections 46 have moved beyond the openings 14 and the posts 30 are resiliently returned to the prestressed position.

Due to the manufacturing tolerances associated with the manufacture of printed circuit boards and molded housings, it is unlikely that the latching shoulders 48 will cooperate with the bottom surface 16 of the circuit board in such a manner as to prevent movement of the shoulder 42 away from the top surface 18 of the printed circuit board 12.

Consequently, deformable webs 50 are positioned on the posts 30 proximate the latching shoulders 48. As the posts are resiliently returned to their unstressed position, the webs 50, as best shown in FIG. 2 cooperate with edges 52 formed between the openings 14 and bottom surface 16 of the circuit board 12. As the webs are made to be easily deformed, the resilient action of the posts provides a sufficient force to cause the webs to be deformed as the webs contact the edges 52. As best shown in FIG. 2, the amount of deformation which each web 50 is forced to undergo is dependent upon various factors, including, but not limited to, the spacing of the opening and posts, the positioning of the connectors, the width of the board, and the tolerances associated therewith.

As the edges 52 of the circuit board essentially dig in to the webs, shoulders are formed in the webs which cooperate with the bottom surface 16 of the circuit board 12. The shoulders of the webs 50 and the shoulders 42 cooperate with the printed circuit board to prevent the movement of the connector relative to the printed circuit board in a direction which is essentially perpendicular to the bottom surface of the board.

It is important that the circuit board 12 not be allowed to move relative to the connector 10, and it is particularly important that the shoulders 42 be maintained in contact with the top surface 18 if the board. In order to maintain the connector in permanent position on the board, the terminals are soldered. As soldering occurs, the solder has a tendency to flow or "wick" up through the openings 14. With the shoulders 42 firmly held against the top surface 18 of the board 12, the problem of solder wicking is eliminated, thereby preventing the solder from flowing to the legs of the terminals and eliminating the problem of the shorting of the terminals.

The use of web 50 provides an effective means of retaining the connector in position on the board. As the web is not predeformed, the web can compensate for any variations in the board thickness. Consequently, the floating of the connector caused by manufacturing tolerances is eliminated and the connector is firmly held in position on the board.

The web 50 can be utilized in many connector designs, and is not limited to use with the connector incorporated herein by reference. Panel mount connectors which are mounted to panels can also incorporate the mounting posts described herein. Other changes in construction will occur to those skilled in the art and various apparently different modifications and embodiments may be made without departing from the scope of the invention. The matter set forth in the foregoing description and accompanying drawings is offered by way of illustration only.

We claim:

1. A panel mount electrical connector comprising: a first mounting surface and at least one mounting post extending therefrom, the first mounting surface is a shoulder provided on the at least one mounting post, the mounting post has a deformable web and the shoulder cooperate to maintain the connector in position on the panel.

2. A panel mount electrical connector as recited in claim 1 wherein the panel is a printed circuit board.

3. A panel mount electrical connector as recited in claim 2 wherein the at least one mounting post has a fixed end past which extends between the shoulder and a bottom wall of the housing, the fixed end portion is a standoff to space the bottom wall from the printed circuit board.

4. A panel mount electrical connector as recited in claim 3 wherein the fixed end portion is integral with the housing and has a circular cross-section, the diameter of the circular cross-section is dimensioned to be greater than the diameter of an opening of the printed circuit board in which the at least one mounting post is positioned when the connector is mounted to the printed circuit board.

5. A panel mount electrical connector as recited in claim 2 wherein the at least one mounting post has a fixed end portion which is integral with the housing and a free end portion which is spaced from the fixed end portion.

6. A panel mount electrical connector as recited in claim 5 wherein a latching projection is provided on the free end portion of the at least one mounting post.

7. A panel mount electrical connector as recited in claim 6 wherein the at least one mounting post is configured to allow the free end portion to be resiliently deflected to a stressed position as a lead-in surface of the latching projection engages a side wall of an opening of the printed circuit board.

8. A panel mount electrical connector as recited in claim 7 wherein as the latching projection is moved beyond the printed circuit board, the mounting portion is returned to a first position, causing the deformable web to be moved into engagement with the printed circuit board, whereby the force associated with the at least one mounting post returning to the first position is sufficient to cause the deformable web to be deformed as it engages the printed circuit board.

9. A panel mount electrical connector as recited in claim 7 wherein the deformable web and the latching projection are integrally molded on the post, the deformable web having a thinner cross-section than the latching projection.

10. A panel mount electrical connector as recited in claim 2 wherein the deformable web cooperates with an edge of the printed circuit board formed between an opening thereof and a bottom surface of the printed circuit board.

11. A panel mount electrical connector comprising:
a first mounting post extending therefrom; the mounting post has a deformable web and a latching projection which are integrally molded thereon, the deformable web has a thinner cross-section than the latching projection;
a mounting surface provided on the panel mount connector;
whereby upon full insertion of the post into an aperture in the panel, the web is permanently deformed by an edge of the aperture to maintain the connector in position on the panel.

12. A panel mount electrical connector as recited in claim 11 wherein the panel is a printed circuit board.

13. A panel mount electrical connector as recited in claim 12 wherein the mounting surface is a shoulder provided on the mounting post.

14. A panel mount electrical connector as recited in claim 12 wherein the mounting post has a fixed end portion which is integral with the housing and a free end portion which is spaced from the fixed end portion.

15. A panel mount electrical connector as recited in claim 14 wherein the mounting post is configured to allow the free end portion to be resiliently deflected to a stressed position as a lead-in surface of the latching projection engages a side wall of an opening of the printed circuit board.

16. A panel mount electrical connector as recited in claim 15 wherein as the latching projection is moved beyond the printed circuit board, the mounting post is returned to a first position, causing the deformable web to be moved into engagement with the printed circuit board, whereby the force associated with the mounting post returning to the first position is sufficient to cause the deformable web to be deformed as it engages the printed circuit board.

17. A printed circuit board electrical connector comprising:
a first mounting surface;
at least one mounting post, the at least one mounting post has a deformable web proximate a free end thereof, the free end is configured to be resilient to allow the free end to be deflected to a stressed position as a portion of the at least one mounting post engages a side wall of an opening of a mountable printed circuit board and to return to an unstressed position as the portion of the at least one mounting post is moved beyond the printed circuit board;
whereby the deformable web is moved into engagement with the printed circuit board causing the deformable web to be deformed as it engages the underside of the printed circuit board.

18. A panel mount electrical connector as recited in claim 17 wherein the deformable web and the latching projection are integrally molded on the post, the deformable web having a thinner cross-section than the latching projection.

* * * * *